(12) United States Patent
Takabayashi

(10) Patent No.: US 12,487,256 B2
(45) Date of Patent: Dec. 2, 2025

(54) VOLTAGE SENSOR AND POWER CONVERSION DEVICE

(71) Applicant: Mitsubishi Electric Corporation, Tokyo (JP)

(72) Inventor: Hirokazu Takabayashi, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 153 days.

(21) Appl. No.: 18/256,068

(22) PCT Filed: Jan. 12, 2021

(86) PCT No.: PCT/JP2021/000727
§ 371 (c)(1),
(2) Date: Jun. 6, 2023

(87) PCT Pub. No.: WO2022/153371
PCT Pub. Date: Jul. 21, 2022

(65) Prior Publication Data
US 2024/0044948 A1    Feb. 8, 2024

(51) Int. Cl.
*G01R 19/10*    (2006.01)
*H02M 7/00*    (2006.01)

(52) U.S. Cl.
CPC ............ *G01R 19/10* (2013.01); *H02M 7/003* (2013.01)

(58) Field of Classification Search
CPC ... G01R 31/3644; G01R 19/10; H02M 7/003; H01M 10/48; H01M 50/55
USPC .............. 324/500, 600, 764.01, 103 R, 771, 324/761.01, 501, 639, 642, 702, 76.11, 324/76.66, 96
See application file for complete search history.

(56) References Cited

U.S. PATENT DOCUMENTS

2009/0183760 A1*  7/2009  Meyer ................. H02M 7/003
                                                                250/252.1
2011/0058391 A1    3/2011  Ueno
(Continued)

FOREIGN PATENT DOCUMENTS

JP    2005012976 A    1/2005
JP    2005027499 A    1/2005
(Continued)

OTHER PUBLICATIONS

International Search Report (PCT/ISA/210) with translation and Written Opinion (PCT/ISA/237) mailed on Apr. 6, 2021 by the Japanese Patent Office as the International Searching Authority for International Application No. PCT/JP2021/000727. (11 pages).
(Continued)

*Primary Examiner* — Huy Q Phan
*Assistant Examiner* — Trung Q Nguyen
(74) *Attorney, Agent, or Firm* — Buchanan Ingersoll & Rooney PC

(57) ABSTRACT

A voltage sensor includes a substrate on which a first electrode, a second electrode, and a measurement circuit are located. The measurement circuit measures a potential difference between the first electrode and the second electrode. The voltage sensor includes a first connecting member for electrically connecting the first electrode to the first busbar and fixing the substrate to the first busbar, and a second connecting member for electrically connecting the second electrode to the second busbar and fixing the substrate to the second busbar.

10 Claims, 17 Drawing Sheets

(56) References Cited

U.S. PATENT DOCUMENTS

| | | | | |
|---|---|---|---|---|
| 2011/0241649 A1* | 10/2011 | Ozawa | ............... | G01R 31/364 |
| | | | | 324/76.11 |
| 2012/0300521 A1* | 11/2012 | Hida | ............... | H05K 7/14329 |
| | | | | 363/131 |
| 2019/0018046 A1* | 1/2019 | Shimizu | ............... | G01R 31/382 |
| 2021/0129655 A1* | 5/2021 | Wang | ............... | B60L 15/20 |
| 2021/0399650 A1* | 12/2021 | Ujimaru | ............... | H02M 1/0032 |
| 2022/0028616 A1* | 1/2022 | Watanabe | ............... | H01G 2/02 |
| 2022/0329080 A1* | 10/2022 | Kobayashi | ............... | B60L 53/62 |
| 2023/0109756 A1* | 4/2023 | Yamazaki | ............... | H05K 7/20272 |
| | | | | 361/699 |
| 2024/0019503 A1* | 1/2024 | Nishimachi | ............... | H02M 3/158 |

FOREIGN PATENT DOCUMENTS

| | | | |
|---|---|---|---|
| JP | 2011061924 A | 3/2011 |
| JP | 2011114872 A | 6/2011 |
| JP | 2015109330 A | 6/2015 |
| JP | 2018067700 A | 4/2018 |

OTHER PUBLICATIONS

Notice of Reasons for Refusal with translation dated May 9, 2023 issued by the Japanese Patent Office in corresponding Japanese Patent Application No. 2022-574889. (8 pages).
Office Action dated Jul. 8, 2025, issued in the corresponding Indian Patent Application No. 202327040816, 5 pages.

\* cited by examiner

FIG.7
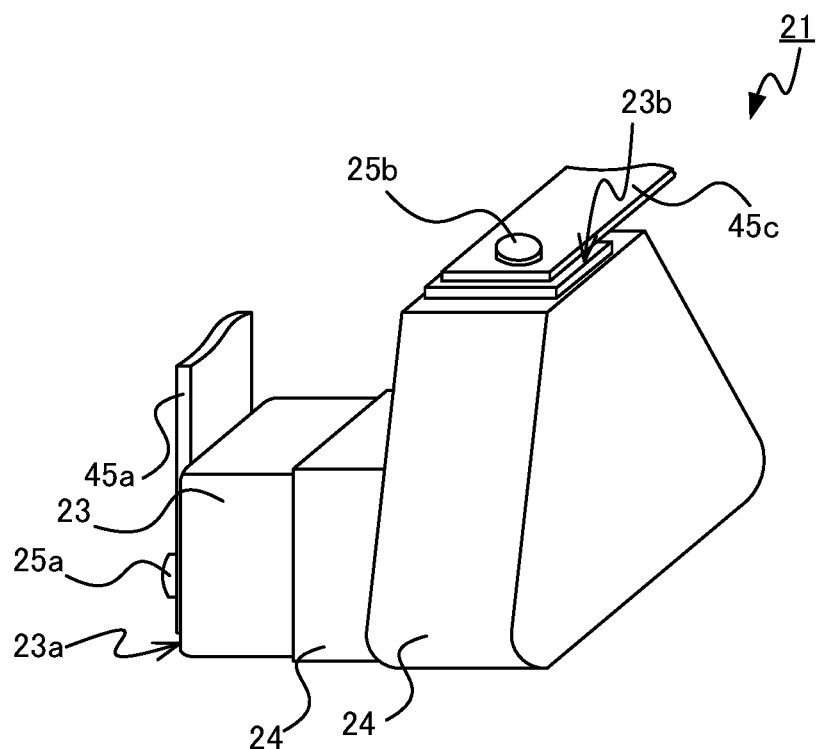
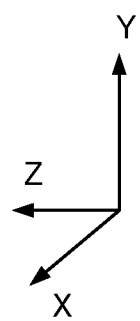

FIG.8
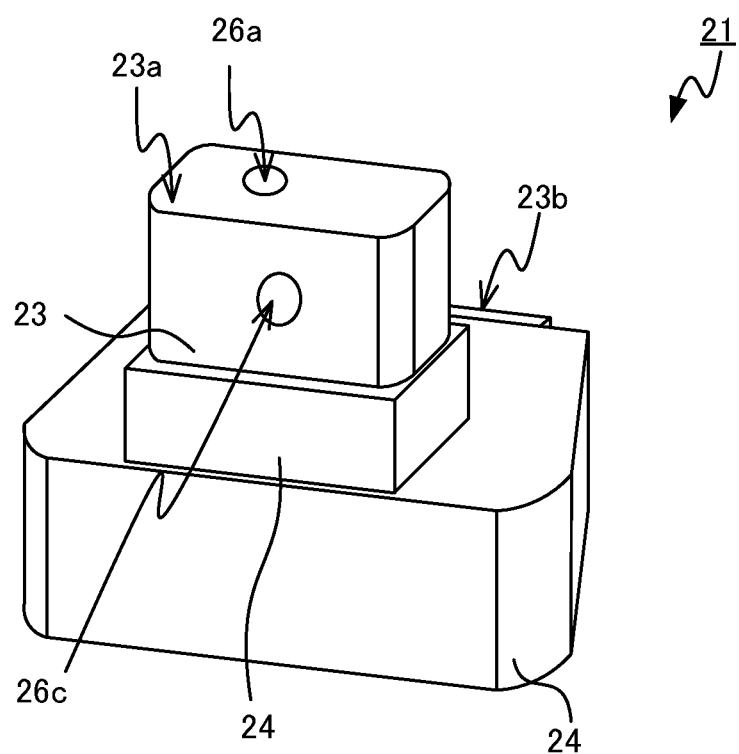
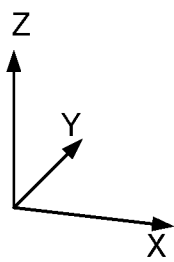

FIG.16
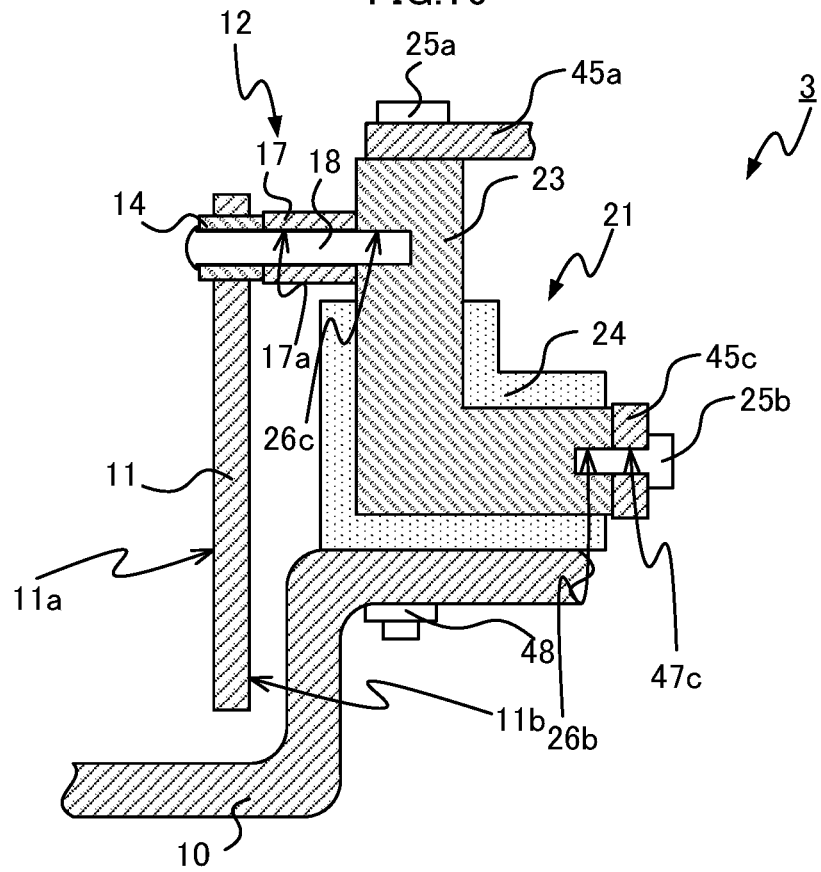
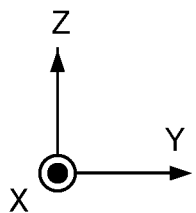

VOLTAGE SENSOR AND POWER CONVERSION DEVICE

TECHNICAL FIELD

The present disclosure relates to a voltage sensor and a power conversion device.

BACKGROUND ART

Some types of electric railway vehicle are provided with a power conversion device that receives direct current (DC) power supplied from a substation through overhead power lines, converts the DC power into an intended alternating current (AC) power, and feeds the AC power to an electric motor. An example of the power conversion device is described in Patent Literature 1. The power conversion device includes an inverter that converts DC power into AC power and feeds the AC power to a motor, and a filter capacitor connected between the primary terminals of the inverter.

The power conversion device further includes a voltage sensor that measures the voltage applied to the filter capacitor, and a current sensor that measures the current flowing through the motor. To control the inverter, the power conversion device includes a control device that calculates modulation factor based on driving commands from a cab, voltage values measured by the voltage sensor, and current values measured by the current sensor and controls switching elements included in the inverter based on the modulation factor.

CITATION LIST

Patent Literature

Patent Literature 1: Unexamined Japanese Patent Application Publication No. 2005-27499

SUMMARY OF INVENTION

Technical Problem

A power conversion device installed in an environment subject to vibrations, such as a power conversion device mounted in a railway vehicle, preferably includes a voltage sensor including a positive input terminal, a negative input terminal, and a measurement circuit for measuring the potential difference between the positive input terminal and the negative input terminal disposed on a fixed substrate to prevent vibration damage to the voltage sensor components. To prevent the substrate from vibrating in the railway vehicle traveling with vibrations, the four corners of the substrate are preferably fixed to the housing of the power conversion device with fixing members.

The voltage sensor can measure the potential difference between a busbar connected to one end of a filter capacitor and a busbar connected to the other end of the filter capacitor to measure the voltage applied to the filter capacitor. The positive input terminal of the voltage sensor is connected through an electric wire to the busbar connected to one end of the filter capacitor, and the negative input terminal is connected through an electric wire to the busbar connected to the other end of the filter capacitor. Each electric wire is installed apart from the fixing members for fixing the substrate to the housing.

In other words, the voltage sensor includes the fixing members for fixing the four corners of the substrate to the housing, and the electric wires installed apart from the fixing members and connecting the positive input terminal and the negative input terminal to the corresponding busbars. Thus, the voltage sensor has a complicated structure and complicated manufacturing processes. This issue may arise for a voltage sensor in any device mounted in an environment subject to vibrations, in addition to a voltage sensor in a power conversion device arranged in a railway vehicle.

In response to the above circumstances, an objective of the present disclosure is to provide a voltage sensor and a power conversion device with a simple structure.

Solution to Problem

To achieve the above objective, a voltage sensor according to the present disclosure is a voltage sensor for measuring a potential difference between a first busbar and a second busbar and includes a substrate, a first connecting member and a second connecting member. A first electrode, a second electrode, and a measurement circuit to measure a potential difference between the first electrode and the second electrode are disposed on the substrate. The first connecting member is for electrically connecting the first electrode to the first busbar and fixing the substrate to the first busbar. The second connecting member is for electrically connecting the second electrode to the second busbar and fixing the substrate to the second busbar.

Advantageous Effects of Invention

The voltage sensor according to the present disclosure includes the first connecting member for electrically connecting the first electrode to the first busbar and fixing the substrate to the first busbar, and the second connecting member for electrically connecting the second electrode to the second busbar and fixing the substrate to the second busbar. The structure eliminates the need for disposing the fixing members for fixing the four corners of the substrate to the housing, and the electric wires installed apart from the fixing members and connecting the positive input terminal and the negative input terminal to the corresponding busbars, thus allowing the voltage sensor and the power conversion device including the voltage sensor to have a simpler structure.

BRIEF DESCRIPTION OF DRAWINGS

FIG. 7 is a perspective view of the first supporting member according to Embodiment 2;

FIG. 8 is a perspective view of the first supporting member according to Embodiment 2;

FIG. 16 is a cross-sectional view of a voltage sensor according to a modification of the embodiments.

DESCRIPTION OF EMBODIMENTS

A voltage sensor and a power conversion device according to embodiments of the present disclosure are described in detail below with reference to the drawings. In the figures, the same reference signs denote the same or equivalent components.

Embodiment 1

A power conversion device 40 that is an example power conversion device mounted in a vehicle and a voltage sensor 1 included in the power conversion device 40 according to Embodiment 1 are described.

Figure 1:
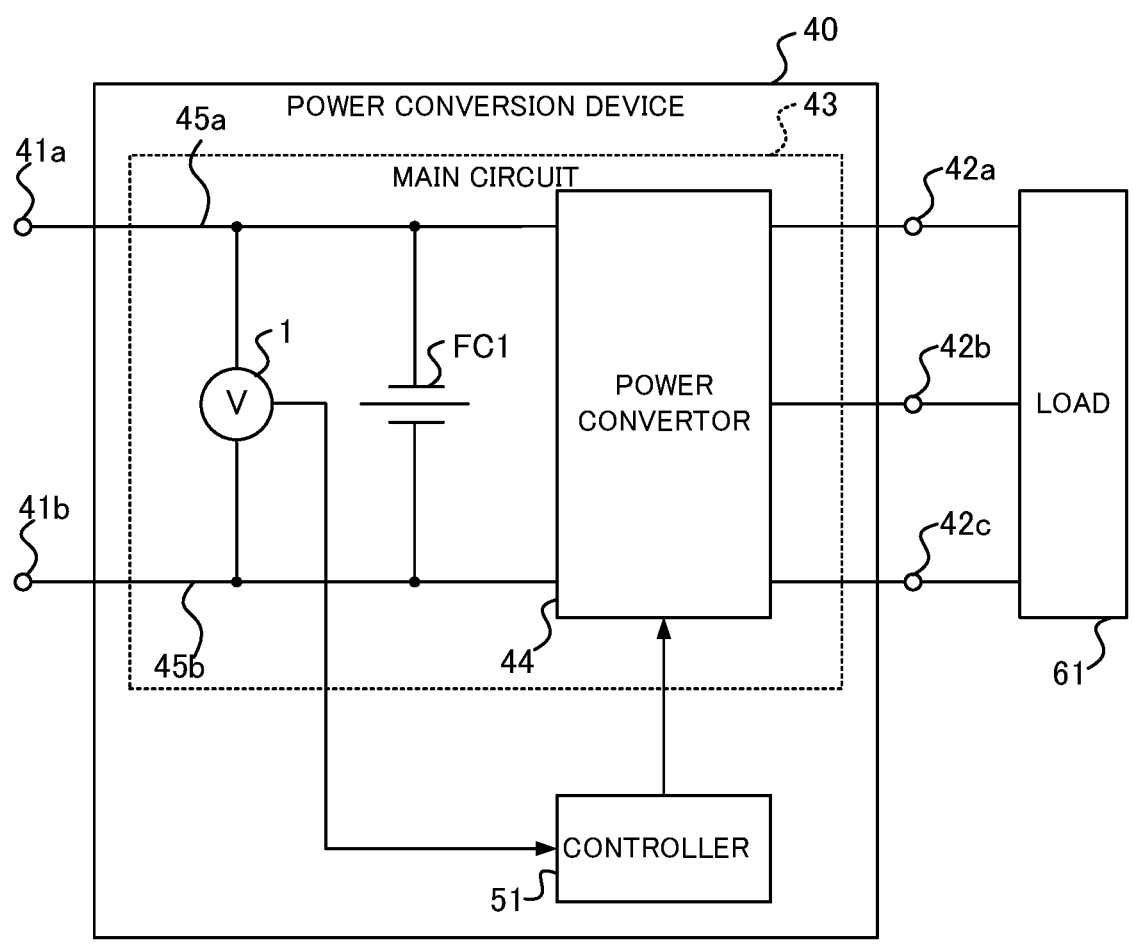
FIG. 1 is a circuit diagram of a power conversion device according to Embodiment 1.

The power conversion device 40 illustrated in FIG. 1 is a direct current (DC)-three-phase converter that converts DC power into three-phase alternating current (AC) power. The power conversion device 40 includes a positive input terminal 41a, a negative input terminal 41b, and output terminals 42a, 42b, and 42c. The output terminals 42a, 42b, and 42c correspond to the respective U, V, and W phases of three-phase AC power.

The power conversion device 40 includes a power convertor 44 that converts DC power supplied from a non-illustrated power supply into electric power for driving a load 61 and feeds the resultant electric power to the load 61, a filter capacitor FC1 connected between the terminals of the power convertor 44 nearer the power supply, the voltage sensor 1 that measures the value of a voltage applied to the filter capacitor FC1, and a controller 51 that controls switching elements included in the power convertor 44.

A high voltage is applied between the positive input terminal 41a and the negative input terminal 41b. For example, a high voltage for DC may be in a range of 400 to 1,500 V inclusive, whereas the effective value of a high voltage for AC may be in a range of 200 to 1,000 V inclusive.

The positive input terminal 41a, the negative input terminal 41b, and the output terminals 42a, 42b, and 42c are electrically connected to the power convertor 44 with busbars. The filter capacitor FC1, the power convertor 44, and the busbars connected to the power convertor 44 are included in a main circuit 43 to which a high voltage is applied.

The components of the power conversion device 40 are described below.

The positive input terminal 41a is electrically connected to the non-illustrated power supply. The power supply is, for example, a current collector that acquires electric power through a power line. The power line is, for example, an overhead power line or a third rail. The current collector is, for example, a pantograph or a current collector shoe. The positive input terminal 41a is preferably electrically connected to the current collector through, for example, a contactor or a filter reactor. The negative input terminal 41b is grounded.

The output terminals 42a, 42b, and 42c are connected to the corresponding input terminals of the load 61, such as a three-phase induction motor.

The power convertor 44 includes a pair of primary terminals electrically connected to the positive input terminal 41a and the negative input terminal 41b. The power convertor 44 includes three secondary terminals corresponding to the U, V, and W phases of three-phase AC power and electrically connected to the output terminals 42a, 42b, and 42c of the power conversion device 40. The power convertor 44 includes multiple switching elements subjected to on-off control performed by the controller 51. The switching elements are, for example, insulated-gate bipolar transistors (IGBTs). The controller 51 controls the on-off state of the switching elements, allowing the power convertor 44 to convert electric power. More specifically, the power convertor 44 converts DC power supplied through the primary terminals into three-phase AC power to be fed to the load 61 and outputs the three-phase AC power from the secondary terminals.

The busbar connecting one primary terminal of the power convertor 44 and the positive input terminal 41a is referred to as a first busbar 45a. The busbar connecting the other primary terminal of the power convertor 44 and the negative input terminal 41b is referred to as a second busbar 45b. The first busbar 45a and the second busbar 45b are plates of a conducting material, such as copper or aluminum.

One end of the filter capacitor FC1 is connected to the first busbar 45a and the other end is connected to the second busbar 45b. The filter capacitor FC1 connected to the first busbar 45a and the second busbar 45b is charged by DC power supplied from the non-illustrated power supply. The filter reactor installed in the circuit between the positive input terminal 41a and the non-illustrated power supply as described above and the filter capacitor FC1 form a filter that reduces harmonic components.

One end of the voltage sensor 1 is connected to the first busbar 45a and the other end is connected to the second busbar 45b. The voltage sensor 1 connected to the first busbar 45a and the second busbar 45b measures the potential difference between an electrode connected to the first busbar 45a and an electrode connected to the second busbar 45b. The one end of the voltage sensor 1 is connected to the first busbar 45a at a position expected to have the same potential as at the connection point on the first busbar 45a to which the one end of the filter capacitor FC1 is connected. The other end of the voltage sensor 1 is connected to the second busbar 45b at a position expected to have the same potential as at the connection point on the second busbar 45b to which the other end of the filter capacitor FC1 is connected. Thus, the potential difference measured by the voltage sensor 1 is a voltage between the terminals of the filter capacitor FC1.

The controller 51 acquires a measurement value from the voltage sensor 1, a driving command from a non-illustrated cab, and a measurement value of a current flowing to the load 61 from a non-illustrated current sensor. The driving command includes a powering command indicating the acceleration of the railway vehicle or a braking command indicating the deceleration of the railway vehicle. The controller 51 calculates the modulation factor based on the measurement value from the voltage sensor 1, the driving command, and the measurement value from the current sensor. The controller 51 performs pulse-width modulation (PWM) control over the power convertor 44 in accordance with the modulation factor. The control allows the power convertor 44 to convert DC power into three-phase AC power as described above.

The structure of the voltage sensor 1 that can simplify the structure of the power conversion device 40 is described below.

Figure 2:
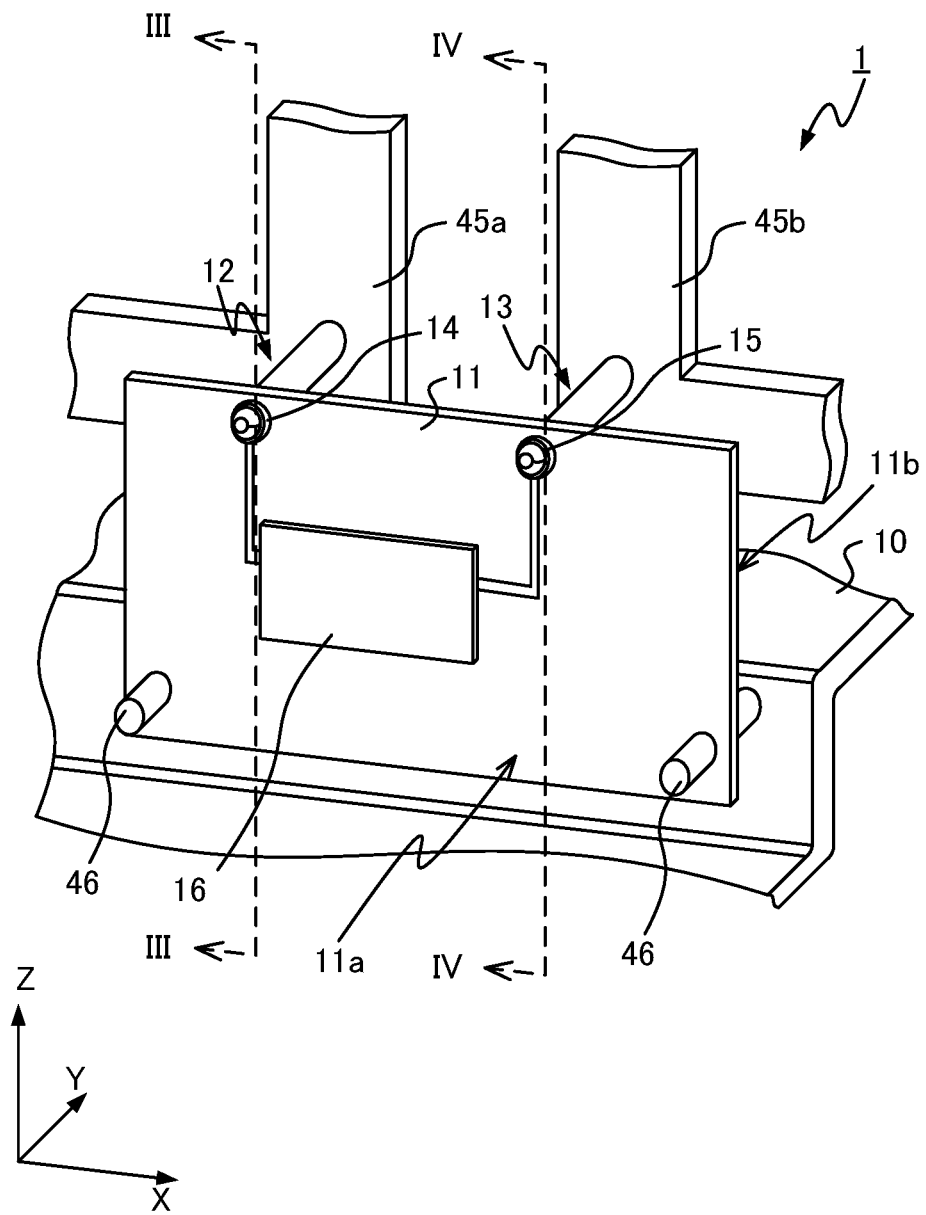
FIG. 2 is a perspective view of a voltage sensor according to Embodiment 1.

As illustrated in FIG. 2, the voltage sensor 1 includes a substrate 11 on which a first electrode 14, a second electrode 15, and a measurement circuit 16 to measure the potential difference between the first electrode 14 and the second electrode 15 are disposed, a first connecting member 12 for electrically connecting the first electrode 14 to the first busbar 45a and fixing the substrate 11 to the first busbar 45a, and a second connecting member 13 for electrically connecting the second electrode 15 to the second busbar 45b and fixing the substrate 11 to the second busbar 45b.

Figure 3:
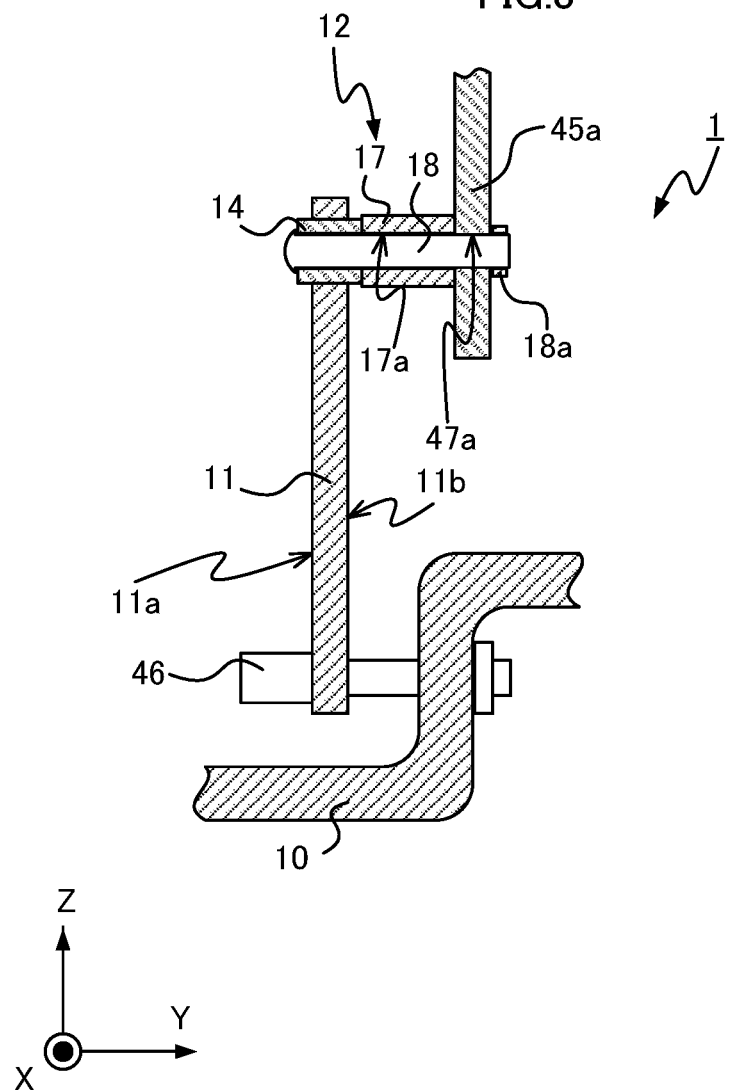
FIG. 3 is a cross-sectional view of the voltage sensor according to Embodiment 1 taken along line III-III in FIG. 2 as viewed in the direction indicated by arrows.
Figure 4:
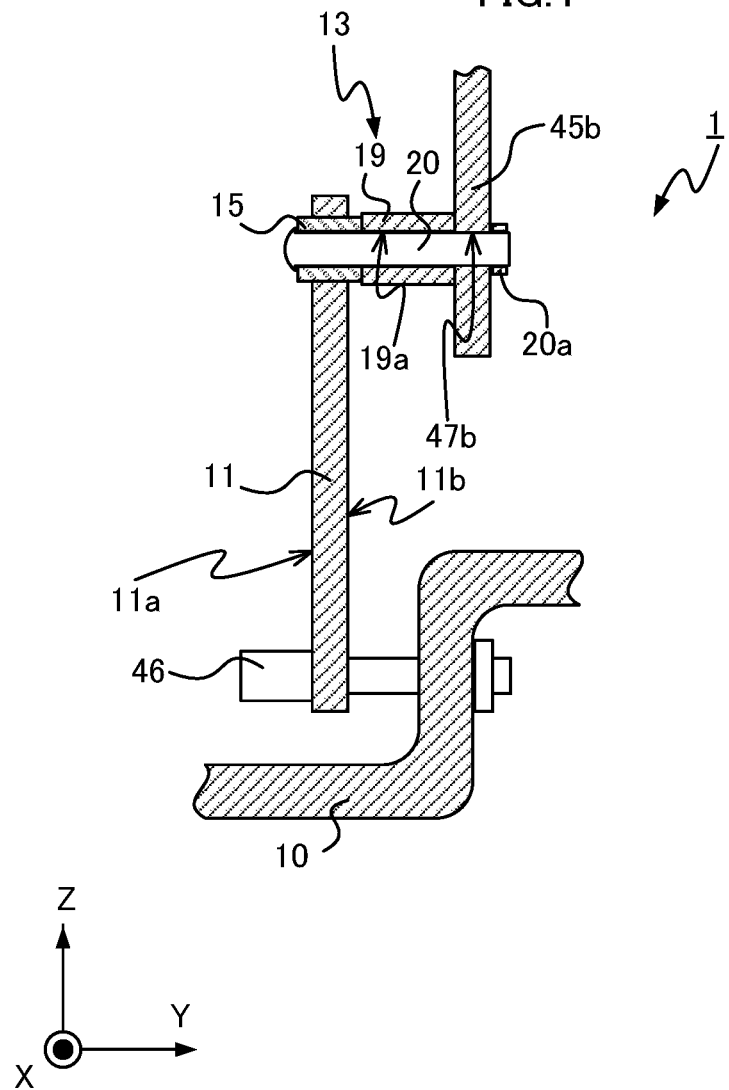
FIG. 4 is a cross-sectional view of the voltage sensor according to Embodiment 1 taken along line IV-IV in FIG. 2 as viewed in the direction indicated by arrows.

In Embodiment 1, as illustrated in FIG. 3 being a cross-sectional view taken along line III-III in FIG. 2 as viewed in the direction indicated by arrows, the first connecting member 12 includes a first collar 17 for electrically connecting the first electrode 14 to the first busbar 45a and a first fastener member 18 for fixing the substrate 11 to the first busbar 45a. As illustrated in FIG. 4 being a cross-sectional view taken along line IV-IV in FIG. 2 as viewed in the direction indicated by arrows, the second connecting member 13 includes a second collar 19 for electrically connecting the second electrode 15 to the second busbar 45b and a second fastener member 20 for fixing the substrate 11 to the second busbar 45b. In FIGS. 2 to 4, Z-axis indicates the vertical direction. The direction normal to the main surface of the substrate 11 is defined as Y-direction. X-axis is orthogonal to each of Y-axis and Z-axis.

A housing 10 accommodates the components of the power conversion device 40 including the main circuit 43. In Embodiment 1, the housing 10 accommodates the power convertor 44, the filter capacitor FC1, the first busbar 45a, the second busbar 45b, the voltage sensor 1, and the controller 51. The housing 10 is at least rigid and strong enough to resist deformation under conditions of the maximum expected vibration from the railway vehicle. For example, the housing 10 is formed from a metal material, such as iron or aluminum.

The substrate 11 has a first main surface 11a and a second main surface 11b opposite to each other. As illustrated in FIG. 2, the substrate 11 is fixed to the housing with the second main surface 11b facing the first busbar 45a and the second busbar More specifically, the substrate 11 is directly fixed, with substrate fixing members 46 formed from an insulating material, to the housing 10 at a position apart from the first electrode 14 and the second electrode 15. In Embodiment 1, the first electrode 14 and the second electrode 15 are disposed at the vertically upper end of the first main surface 11a. The substrate 11 is directly fixed to the housing 10 at the vertically lower end with two substrate fixing members 46.

The substrate fixing members 46 are preferably at least rigid and strong enough to resist deformation under conditions of the maximum expected vibration from the railway vehicle. For example, the substrate fixing members 46 may be formed from the same metal material as the housing 10 through insulation processing.

The first electrode 14 is connected to the first busbar 45a at a position expected to have the same potential as at the connection point on the first busbar 45a to which the one end of the filter capacitor FC1 is connected.

The first electrode 14 includes an electric conductor that is tubular and that extends through the substrate 11 from the first main surface 11a to the second main surface 11b as illustrated in FIG. 3. The first electrode 14 has a shape that allows contact with the first collar 17. In Embodiment 1, the end of the first electrode 14 nearer the second main surface 11b has a shape that allows surface contact with the end face of the first collar 17. The first electrode 14 is preferably at least rigid and strong enough to resist deformation under stress from the first collar 17 with the substrate 11 fixed to the first busbar 45a.

The second electrode 15 is connected to the second busbar 45b at a position expected to have the same potential as at the connection point on the second busbar 45b to which the other end of the filter capacitor FC1 is connected.

The second electrode 15 includes an electric conductor that is tubular and that extends through the substrate 11 from the first main surface 11a to the second main surface 11b as illustrated in FIG. 4. The second electrode 15 has a shape that allows contact with the second collar 19. In Embodiment 1, the end of the second electrode 15 nearer the second main surface 11b has a shape that allows surface contact with the end face of the second collar 19. The second electrode 15 is preferably at least rigid and strong enough to resist deformation under stress from the second collar 19 with the substrate 11 fixed to the second busbar 45b.

As illustrated in FIG. 2, the measurement circuit 16 is disposed on the first main surface 11a. The measurement circuit 16 includes, for example, a resistance element, a transformer, and a noise filter.

The first collar 17 includes an electric conductor that is tubular and that has a through-hole 17a as described in FIG. 3. For example, the first collar 17 is formed from copper and has a cylindrical shape. The contact of the first collar 17 with each of the first electrode 14 and the first busbar 45a electrically connects the first busbar 45a to the first electrode 14 through the first collar 17.

The first fastener member 18 is disposed through the through-hole 17a in the first collar 17. The first fastener member 18 disposed through the through-hole 17a fixes the substrate 11 to the first busbar 45a with the first collar 17 in contact with the first electrode 14 and the first busbar 45a. With the first collar 17 in contact with the first electrode 14 and the first busbar 45a, the fixation of the substrate 11 to the first busbar 45a suppresses movement of the first busbar 45a toward the substrate 11.

The first fastener member 18 is, for example, a bolt having a threaded side surface and a screw head at one end. The first fastener member 18 is disposed through the first electrode 14, the through-hole 17a in the first collar 17, and a fixation hole 47a in the first busbar 45a and is fixed with a nut 18a. The fixation hole 47a in the first busbar 45a extends through the first busbar 45a in the direction orthogonal to the main surface of the first busbar 45a. More specifically, with the first electrode 14 and the first collar 17 between the screw head of the first fastener member 18 and the first busbar 45a, the nut 18a is tightened on the first fastener member 18. This electrically connects the first electrode 14 to the first busbar 45a through the first collar 17 and fixes the substrate 11 to the first busbar 45a. The first electrode 14 and the first collar 17 are held between the first fastener member 18 and the first busbar 45*a*. Thus, the first fastener member 18 is preferably formed from a material harder and more rigid than the material of the first collar 17, such as iron.

The first fastener member 18 formed from iron preferably has lower conductivity than the first collar 17. The first collar 17 may be formed from, for example, copper so as to have conductivity higher than conductivity of the first fastener member 18, allowing a current to flow from the first busbar 45*a* to the first electrode 14 through the first collar 17. The amount of heat generated by a current flowing through the first collar 17 formed from copper is smaller than the amount of heat generated by a current flowing through the first fastener member 18 formed from iron. In other words, the first collar 17 of copper and the first fastener member 18 of iron may be installed to suppress increase in the amount of heat in the first connecting member 12.

The second collar 19 includes an electric conductor that is tubular and that has a through-hole 19*a* as illustrated in FIG. 4. For example, the second collar 19 is formed from copper and has a cylindrical shape. The contact of the second collar 19 with each of the second electrode 15 and the second busbar 45*b* electrically connects the second busbar 45*b* to the second electrode 15.

The second fastener member 20 is disposed through the through-hole 19*a* in the second collar 19. The second fastener member 20 disposed through the through-hole 19*a* fixes the substrate 11 to the second busbar 45*b* with the second collar 19 in contact with the second electrode 15 and the second busbar 45*b*. With the second collar 19 in contact with the second electrode 15 and the second busbar 45*b*, the fixation of the substrate 11 to the second busbar 45*b* suppresses movement of the second busbar 45*b* toward the substrate 11.

The second fastener member 20 is, for example, a bolt having a threaded side surface and a screw head at one end. The second fastener member 20 is disposed through the second electrode 15, the through-hole 19*a* in the second collar 19, and a fixation hole 47*b* in the second busbar 45*b* and is fixed with a nut 20*a*. The fixation hole 47*b* in the second busbar 45*b* extends through the second busbar 45*b* in the direction orthogonal to the main surface of the second busbar 45*b*. More specifically, with the second electrode 15 and the second collar 19 between the screw head of the second fastener member 20 and the second busbar 45*b*, the nut 20*a* is tightened on the second fastener member 20. This electrically connects the second electrode 15 to the second busbar 45*b* through the second collar 19 and fixes the substrate 11 to the second busbar 45*b*. The second electrode 15 and the second collar 19 are held between the second fastener member 20 and the second busbar 45*b*. Thus, the second fastener member 20 is preferably formed from a material harder and more rigid than the material of the second collar 19, such as iron.

The second fastener member 20 formed from iron preferably has lower conductivity than the second collar 19. The second collar 19 may be formed from, for example, copper so as to have conductivity higher than conductivity of the second fastener member 20, allowing a current to flow from the second electrode 15 to the second busbar 45*b* through the second collar 19. The amount of heat generated by a current flowing through the second collar 19 formed from copper is smaller than the amount of heat generated by a current flowing through the second fastener member 20 formed from iron. In other words, the second collar 19 of copper and the second fastener member 20 of iron may be installed to suppress increase in the amount of heat in the second connecting member 13.

When the first busbar 45*a* is electrically connected to the first electrode 14, and the second busbar 45*b* is electrically connected to the second electrode 15 as described above, the measurement circuit 16 can measure the potential difference between the first busbar 45*a* and the second busbar 45*b*. As described above, the first electrode 14 is connected to the first busbar 45*a*, and the second electrode 15 is connected to the second busbar 45*b*. Thus, the potential of the first electrode 14 is expected to be the same as the potential of the one end of the filter capacitor FC1, and the potential of the second electrode 15 is expected to be the same as the potential of the other end of the filter capacitor FC1. In other words, the measurement circuit 16 can measure the voltage between the terminals of the filter capacitor FC1 with the two terminals connected correspondingly to the first busbar 45*a* and the second busbar 45*b*.

As described above, the voltage sensor 1 according to Embodiment 1 includes the first connecting member 12 for electrically connecting the first electrode 14 to the first busbar 45*a* and fixing the substrate 11 to the first busbar 45*a*, and the second connecting member 13 for electrically connecting the second electrode 15 to the second busbar 45*b* and fixing the substrate 11 to the second busbar 45*b*. Thus, the voltage sensor 1 has a simpler structure and simpler manufacturing processes than a voltage sensor including fixing members for fixing the four corners of a substrate to the housing and electric wiring installed apart from the fixing members and connecting each electrode on the substrate to the corresponding busbar. The power conversion device 40 including the voltage sensor 1 has a simple structure and simple manufacturing processes accordingly.

Embodiment 2

The method of electrically connecting the first electrode 14 and the second electrode 15 to busbars and fixing the substrate 11 to the busbars is not limited to the above example. In Embodiment 2, a voltage sensor 2 is described in which, using supporting members for electrically connecting multiple busbars to each other and holding the busbars, the first electrode 14 and the second electrode 15 are electrically connected to the busbars and the substrate 11 is fixed to the supporting members.

Figure 5:
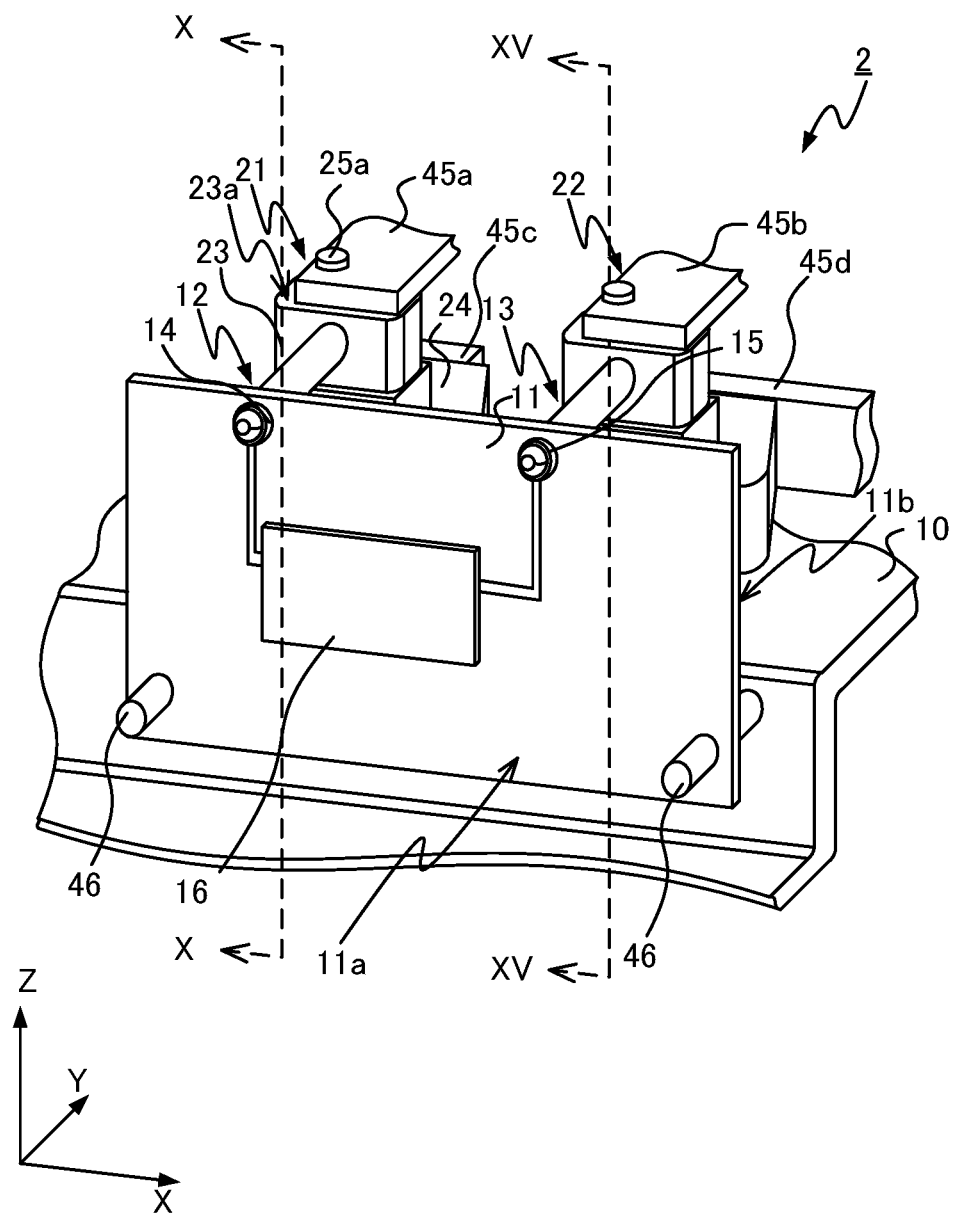
FIG. 5 is a perspective view of a voltage sensor according to Embodiment 2.

As illustrated in FIG. 5, the voltage sensor 2 includes a first supporting member 21 for electrically connecting a first busbar 45*a* and a third busbar 45*c* and supporting the first busbar 45*a* and the third busbar 45*c*, and a second supporting member 22 for electrically connecting a second busbar 45*b* and a fourth busbar 45*d* and supporting the second busbar 45*b* and the fourth busbar 45*d*. The first supporting member 21 and the second supporting member 22 accommodated in the housing 10 and fixed to the housing 10 are held on the housing 10. The first supporting member 21 held on the housing 10 supports the first busbar 45*a* and the third busbar 45*c*, and the second supporting member 22 held on the housing 10 supports the second busbar 45*b* and the fourth busbar 45*d*. This structure suppresses vibrations of each busbar when the railway vehicle travels.

In Embodiment 2, the positive input terminal 41*a* is connected to one of the primary terminals of the power convertor 44 through the first busbar 45*a*, the third busbar and the first supporting member 21 for electrically connecting the first busbar 45*a* and the third busbar 45*c* to each other. The negative input terminal 41*b* is connected to the other of the primary terminals of the power convertor 44 through the second busbar the fourth busbar 45*d*, and the second supporting member 22 for electrically connecting the second busbar 45b and the fourth busbar 45d to each other.

Figure 6:
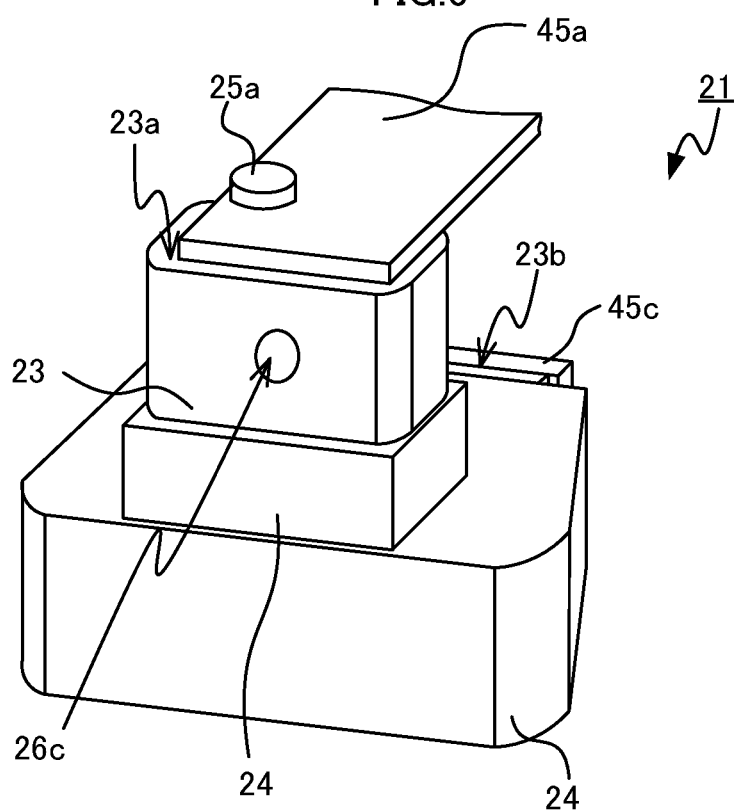
FIG. 6 is a perspective view of a first supporting member according to Embodiment 2.

As illustrated in FIGS. 6 and 7, the first supporting member 21 includes a first conductive member 23 for electrically connecting the first busbar 45a and the third busbar 45c to each other, and a first insulating member 24 covering the outer surface of the first conductive member 23 and insulating the first conductive member 23 from the housing 10.

The outer surface of the first conductive member 23 is covered with the first insulating member 24 with end portions 23a and 23b exposed. The first conductive member 23 is formed from a conducting material, such as copper. In Embodiment 2, the first conductive member 23 is a bent column. More specifically, the first conductive member 23 has a columnar part extending in Z-direction and a columnar part extending in Y-direction.

With the first busbar 45a in contact with the end portion 23a of the first conductive member 23, the first busbar 45a is fixed to the end portion 23a with a fastener member 25a. The fastener member 25a is formed from, for example, a metal material. As illustrated in FIG. 8, without illustrating the first busbar 45a and the third busbar 45c in FIG. 6, the end portion 23a has a fixation hole 26a extending in Z-direction for fixing the first busbar 45a. The first busbar 45a has a fixation hole 47a as in Embodiment 1.

With the fastener member 25a received through the fixation hole 47a in the first busbar 45a being received and fixed in the fixation hole 26a in the end portion 23a, the first busbar 45a is fixed to the end portion 23a of the first conductive member 23. For example, the fastener member 25a is a bolt having a threaded side surface and a screw head at one end, and the fixation hole 26a is a threaded hole for receiving the fastener member 25a. The first busbar 45a is fixed to the end portion 23a by tightening the fastener member 25a received in the fixation hole 26a through the fixation hole 47a in the first busbar 45a.

Figure 9:
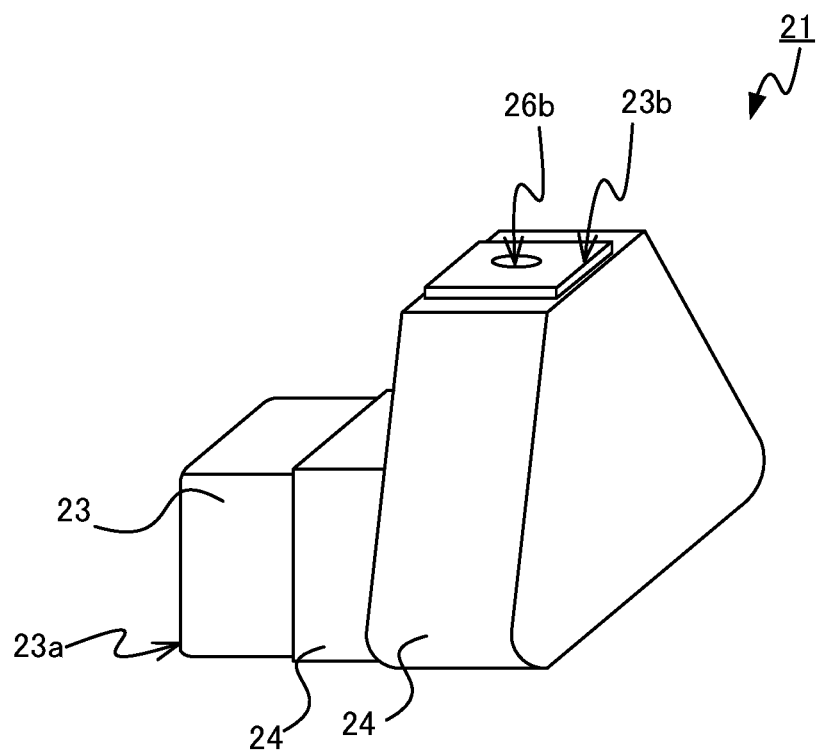
FIG. 9 is a perspective view of the first supporting member according to Embodiment 2.
Figure 10:
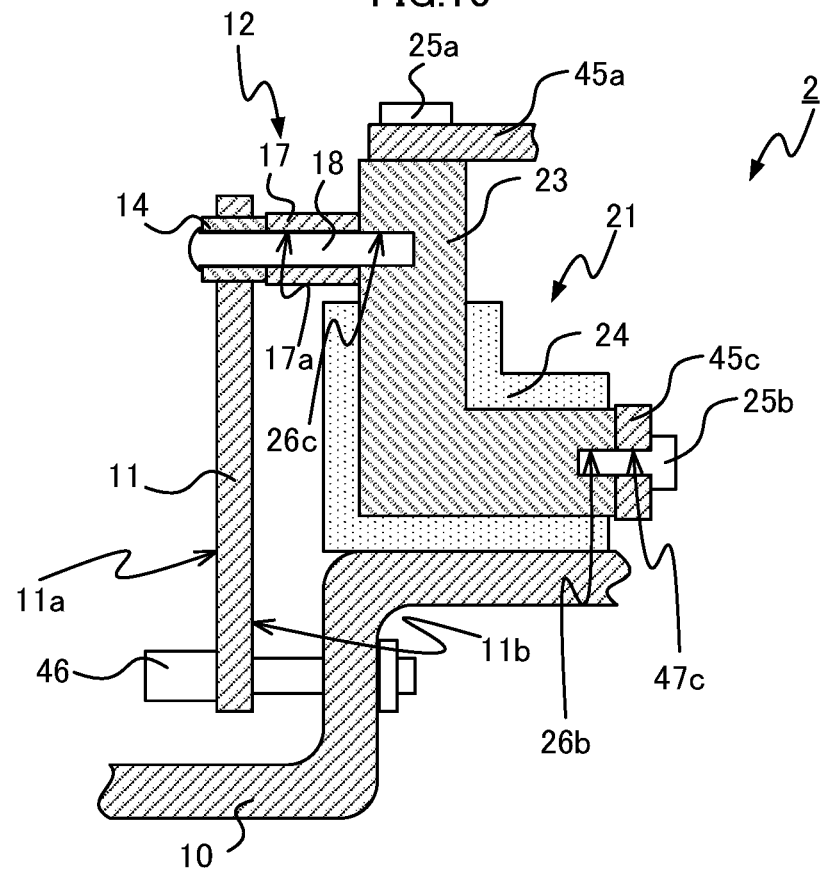
FIG. 10 is a cross-sectional view of the voltage sensor according to Embodiment 2 taken along line X-X in FIG. 5 as viewed in the direction indicated by arrows.

As illustrated in FIG. 7, with the third busbar 45c in contact with the end portion 23b of the first conductive member 23, the third busbar 45c is fixed to the end portion 23b with a fastener member 25b. The fastener member 25b is formed from, for example, a metal material. As illustrated in FIG. 9, without illustrating the first busbar 45a and the third busbar 45c in FIG. 7, the end portion 23b has a fixation hole 26b extending in Y-direction for fixing the third busbar 45c. As illustrated in FIG. 10 being a cross-sectional view taken along line X-X in FIG. 5 as viewed in the direction indicated by arrows, the third busbar 45c has a fixation hole 47c that is a through-hole extending through the third busbar 45c in the direction orthogonal to the main surface of the third busbar 45c.

With the fastener member 25b received through the fixation hole 47c in the third busbar 45c being received and fixed in the fixation hole 26b in the end portion 23b, the third busbar 45c is fixed to the first conductive member 23. For example, the fastener member 25b is a bolt having a threaded side surface and a screw head at one end, and the fixation hole 26b is a threaded hole for receiving the fastener member 25b. The third busbar 45c is fixed to the end portion 23b by tightening the fastener member 25b received in the fixation hole 26b through the fixation hole 47c in the third busbar 45c.

As illustrated in FIGS. 6 and 8, the end portion 23a of the first conductive member 23 has a fixation hole 26c extending in Y-direction for fixing the substrate 11. The fixation hole 26c is disposed to be discontinuous from the fixation hole 26a for insertion of the fastener member 25a. As illustrated in FIG. 10, the first fastener member 18 included in the first connecting member 12 is disposed through the first electrode 14 and through the first collar 17. In this state, the first fastener member 18 is received and fixed in the fixation hole 26c to fix the substrate 11 to the first conductive member 23. For example, the first fastener member 18 is a bolt having a threaded side surface and a screw head at one end, and the fixation hole 26c is a threaded hole for receiving the first fastener member 18. The substrate 11 is fixed to the end portion 23a by tightening the first fastener member 18 received in the fixation hole 26c through the through-hole 17a in the first collar 17.

The first collar 17 is in contact with each of the first electrode 14 and the first conductive member 23. In other words, the first conductive member 23 is electrically connected to the first electrode 14 through the first collar 17. Thus, the first busbar 45a and the third busbar 45c electrically connected to each other by the first conductive member 23 are electrically connected to the first electrode 14 through the first conductive member 23.

The first insulating member 24 is formed from an insulating material, such as a synthetic resin. The first insulating member 24 is preferably at least rigid and strong enough to resist deformation under conditions of the maximum expected vibration from the vehicle provided with the power conversion device 40. In Embodiment 2, the first insulating member 24 has one part with a columnar shape covering the outer surface of the first conductive member 23 extending in Z-direction, and the other part with a shape covering the outer surface of the first conductive member 23 extending in Y-direction and substantially being polygonal in a cross section orthogonal to Z-direction.

The first insulating member 24 that is insulating is fixed to the housing 10 and held on the housing 10. The first insulating member 24 covers the outer surface of the first conductive member 23 and insulates the housing 10 from the first conductive member 23 as well as from the first busbar 45a and the third busbar 45c connected to the first conductive member 23. This allows the first supporting member 21 to support the first busbar 45a and the third busbar 45c being insulated from the housing 10.

Figure 11:
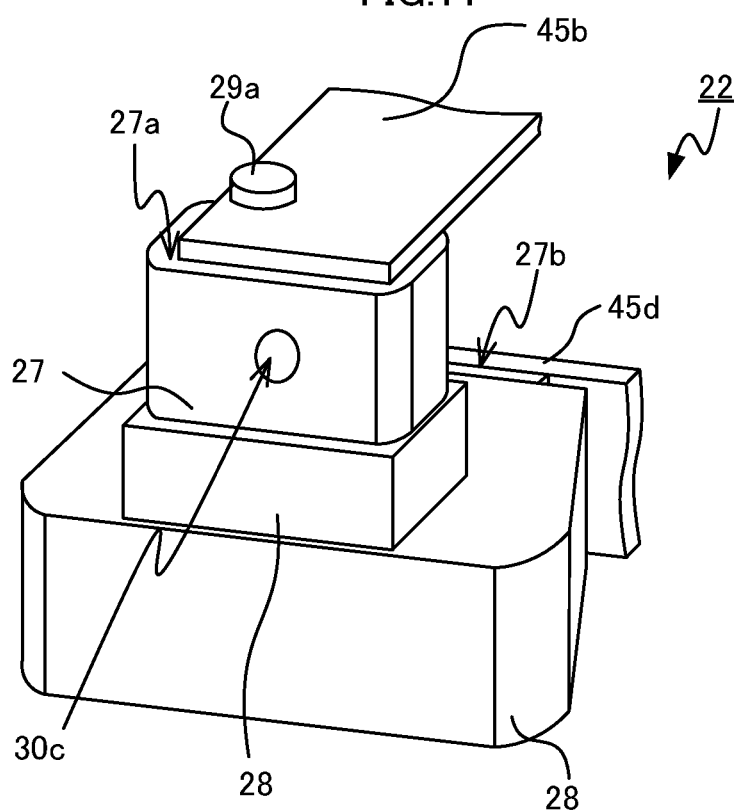
FIG. 11 is a perspective view of a second supporting member according to Embodiment 2.
Figure 12:
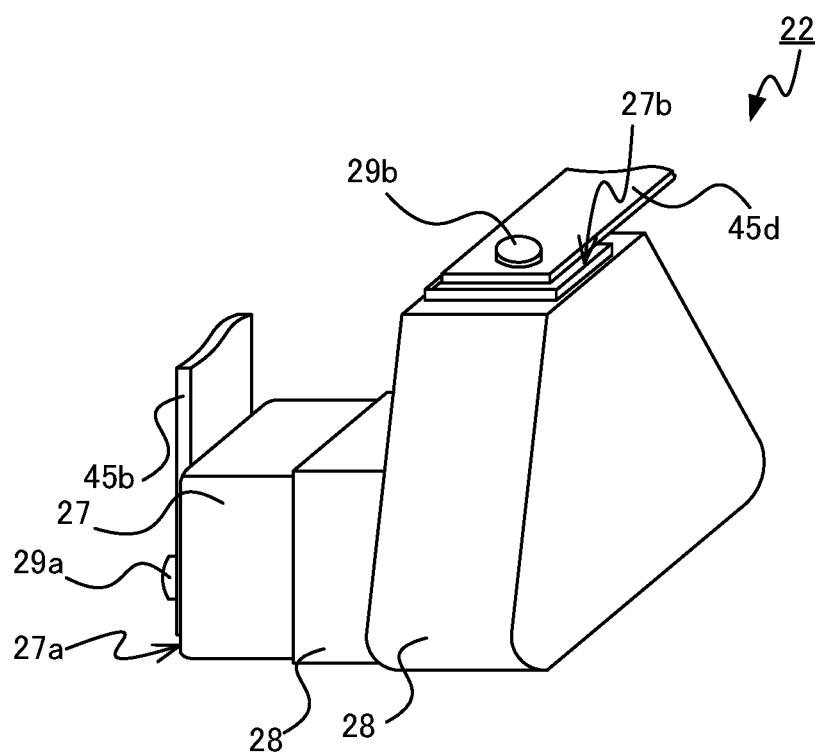
FIG. 12 is a perspective view of the second supporting member according to Embodiment 2.

As illustrated in FIGS. 11 and 12, the second supporting member 22 includes a second conductive member 27 for electrically connecting the second busbar and the fourth busbar 45d to each other and a second insulating member 28 covering the outer surface of the second conductive member 27 and insulating the second conductive member 27 from the housing 10.

The outer surface of the second conductive member 27 is covered with the second insulating member 28 with end portions 27a and 27b exposed. The second conductive member 27 is formed from a conducting material, such as copper. In Embodiment 2, the second conductive member 27 is a bent column. More specifically, the second conductive member 27 has a columnar part extending in Z-direction and a columnar part extending in Y-direction.

Figure 13:
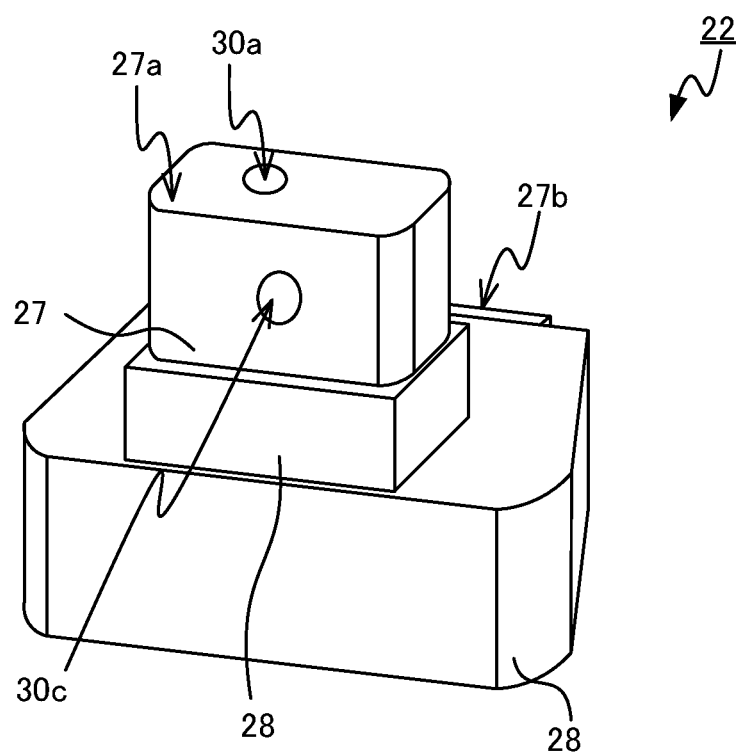
FIG. 13 is a perspective view of the second supporting member according to Embodiment 2.

With the second busbar 45b in contact with the end portion 27a of the second conductive member 27, the second busbar 45b is fixed to the end portion 27a with a fastener member 29a. The fastener member 29a is formed from, for example, metal. As illustrated in FIG. 13, without illustrating the second busbar 45b and the fourth busbar in FIG. 11, the end portion 27a has a fixation hole 30a extending in Z-direction for fixing the second busbar 45b.

With the fastener member 29a received through the fixation hole 47b in the second busbar 45b being received and fixed in the fixation hole 30a in the end portion 27a, the second busbar 45b is fixed to the end portion 27a of the second conductive member 27. For example, the fastener member 29a is a bolt having a threaded side surface and a screw head at one end, and the fixation hole 30a is a threaded hole for receiving the fastener member 29a. The second busbar 45b is fixed to the end portion 27a by tightening the fastener member 29a received in the fixation hole 30a through the fixation hole 47b in the second busbar 45b.

Figure 14:
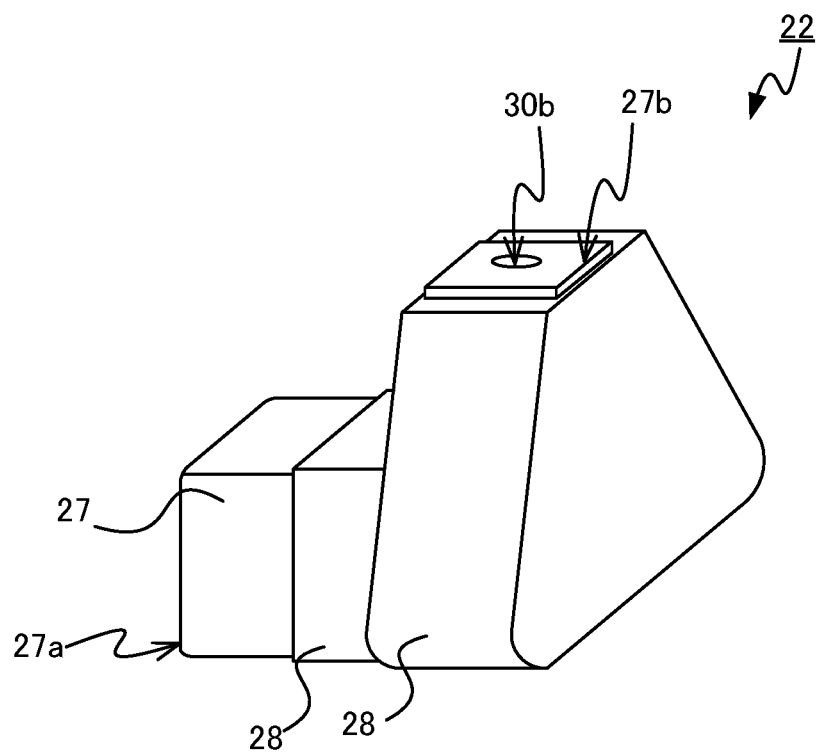
FIG. 14 is a perspective view of the second supporting member according to Embodiment 2.
Figure 15:
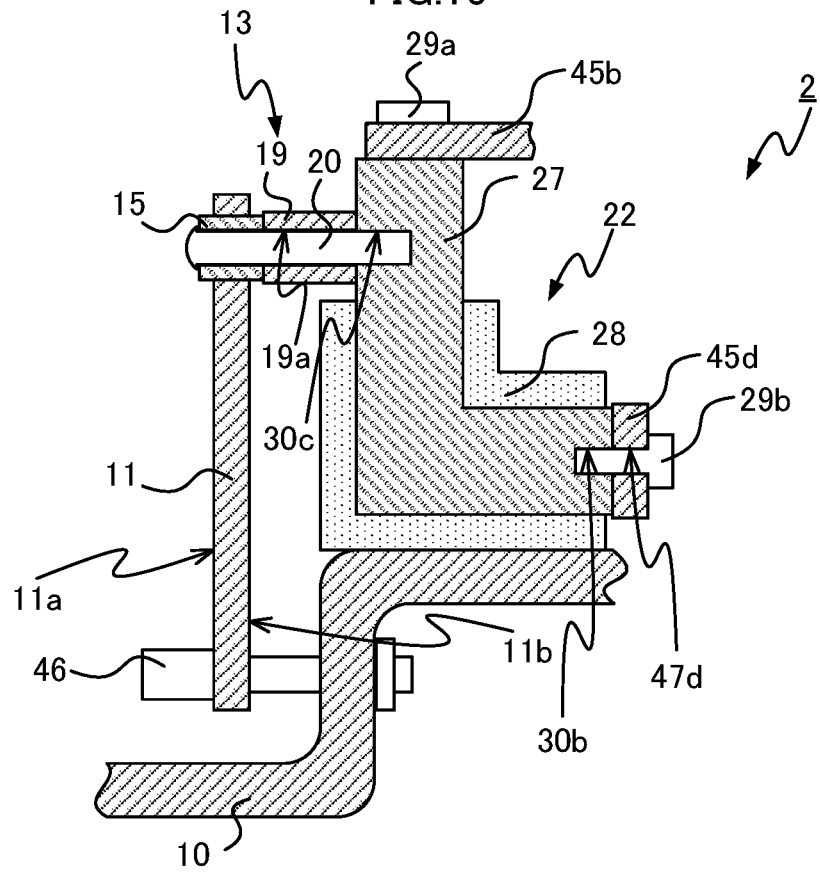
FIG. 15 is a cross-sectional view of the voltage sensor according to Embodiment 2 taken along line XV-XV in FIG. 5 as viewed in the direction indicated by arrows.

As illustrated in FIG. 12, with the fourth busbar 45d in contact with the end portion 27b of the second conductive member 27, the fourth busbar 45d is fixed to the end portion 27b with a fastener member 29b. The fastener member 29b is formed from, for example, a metal material. As illustrated in FIG. 14, without illustrating the second busbar 45b and the fourth busbar 45d in FIG. 12, the end portion 27b has a fixation hole 30b extending in Y-direction for fixing the fourth busbar 45d. As illustrated in FIG. 15 being a cross-sectional view taken along line XV-XV in FIG. 5 as viewed in the direction indicated by arrows, the fourth busbar 45d has a fixation hole 47d that is a through-hole extending through the fourth busbar 45d in the direction orthogonal to the main surface of the fourth busbar 45d.

With the fastener member 29b received through the fixation hole 47d in the fourth busbar 45d being received and fixed in the fixation hole 30b in the end portion 27b, the fourth busbar 45d is fixed to the second conductive member 27. For example, the fastener member 29b is a bolt having a threaded side surface and a screw head at one end, and the fixation hole 30b is a threaded hole for receiving the fastener member 29b. The fourth busbar 45d is fixed to the end portion 27b by tightening the fastener member 29b received in the fixation hole 30b through the fixation hole 47d in the fourth busbar 45d and.

As illustrated in FIGS. 11 and 13, the end portion 27a of the second conductive member 27 has a fixation hole 30c extending in Y-direction for fixing the substrate 11. The fixation hole 30c is disposed to be discontinuous from the fixation hole 30a for insertion of the fastener member 29a. As illustrated in FIG. 15, the second fastener member 20 included in the second connecting member 13 is disposed through the second electrode 15 and through the second collar 19. In this state, the second fastener member 20 is received and fixed in the fixation hole 30c to fix the substrate 11 to the second conductive member 27. For example, the second fastener member 20 is a bolt having a threaded side surface and a screw head at one end, and the fixation hole 30c is a threaded hole for receiving the second fastener member 20. The substrate 11 is fixed to the end portion 27a by tightening the second fastener member 20 received in the fixation hole 30c through the through-hole 19a in the second collar 19.

The second collar 19 is in contact with each of the second electrode 15 and the second conductive member 27. In other words, the second conductive member 27 is electrically connected to the second electrode 15 through the second collar 19. Thus, the second busbar 45b and the fourth busbar 45d electrically connected to each other by the second conductive member 27 are electrically connected to the second electrode 15 through the second conductive member 27.

The second insulating member 28 is formed from an insulating material, such as a synthetic resin. The second insulating member 28 is preferably at least rigid and strong enough to resist deformation under conditions of the maximum expected vibration from the vehicle provided with the power conversion device 40. In Embodiment 2, the second insulating member 28 has one part with a columnar shape covering the outer surface of the second conductive member 27 extending in Z-direction, and the other part with a shape covering the outer surface of the second conductive member 27 extending in Y-direction and substantially being polygonal in a cross section orthogonal to Z-direction.

The second insulating member 28 that is insulating is in contact with the housing 10 and held on the housing 10. The second insulating member 28 covers the outer surface of the second conductive member 27 and insulates the housing 10 from the second conductive member 27 as well as from the second busbar 45b and the fourth busbar 45d connected to the second conductive member 27. This allows the second supporting member 22 to support the second busbar 45b and the fourth busbar 45d being insulated from the housing 10.

When the first conductive member 23 is electrically connected to the first electrode 14, and the second conductive member 27 is electrically connected to the second electrode 15 as described above, the measurement circuit 16 can measure the potential difference between the first conductive member 23 and the second conductive member 27. The potential difference between the first conductive member 23 and the second conductive member 27 is expected to be the same as the potential difference between the third busbar 45c and the fourth busbar 45d. In other words, the measurement circuit 16 can measure the voltage between the terminals of the filter capacitor FC1 with the two terminals connected correspondingly to the third busbar 45c and the fourth busbar 45d.

As described above, the voltage sensor 2 according to Embodiment 2 includes the first connecting member 12 for (i) electrically connecting the first electrode 14 to the first conductive member 23 for electrically connecting the first busbar 45a and the third busbar 45c to each other and (ii) fixing the substrate 11 to the first conductive member 23. The voltage sensor 2 further includes the second connecting member 13 for (i) electrically connecting the second electrode 15 to the second conductive member 27 for electrically connecting the second busbar 45b and the fourth busbar 45d to each other and (ii) fixing the substrate 11 to the second conductive member 27. Thus, the voltage sensor 2 has a simpler structure and simpler manufacturing processes than a voltage sensor including fixing members for fixing the four corners of a substrate to the housing and electric wiring installed apart from the fixing members and connecting each electrode on the substrate to the corresponding busbar. The power conversion device 40 including the voltage sensor 2 has a simple structure and simple manufacturing processes accordingly.

The fixation of the substrate 11 to the housing 10 with the substrate 11 fixed to the first conductive member 23 and the second conductive member 27 reduces vibrations received by the substrate 11.

The present disclosure is not limited to the above embodiments. The embodiments may be combined. In one example, the positive input terminal 41a may be connected to one of the primary terminals of the power convertor 44 through the first busbar 45a, and the negative input terminal 41b may be connected to the other of the primary terminals of the power convertor 44 through the second busbar 45b and the fourth busbar 45d. In this case, the first electrode 14 on the substrate 11 included in the voltage sensor 1 may be connected to the first busbar 45a that connects the positive input terminal 41a and the power convertor 44. The second electrode 15 on the substrate 11 may be connected to the second conductive member 27 included in the second supporting member 22 that supports the second busbar 45b and the fourth busbar 45d.

In Embodiment 1, the vertically lower part of the substrate 11 is fixed to the housing 10 with the substrate fixing members 46. However, the substrate fixing members 46 may not be used. The vertically lower part of the substrate 11 may be fixed to the housing 10 by any technique such as fitting or bonding.

As illustrated in FIG. 16, a first supporting member 21 included in a voltage sensor 3 is directly fixed to the housing 10 with a supporting-member-fixing member 48. A second supporting member 22 having the same structure as the first supporting member 21 is also directly fixed to the housing 10 with a supporting-member-fixing member 48.

Figure 17:
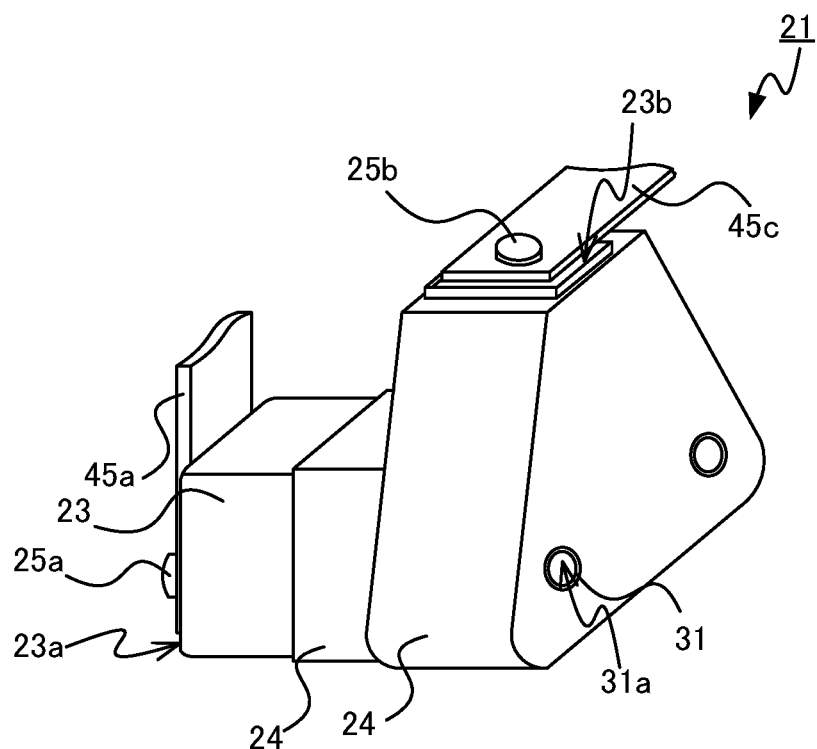
FIG. 17 is a perspective view of a first supporting member according to the modification of the embodiments.

As illustrated in FIG. 17, a holding member 31 having an insertion hole 31a for insertion of the supporting-member-fixing member 48 is embedded in the first insulating member 24 included in the first supporting member 21 illustrated in FIG. 16. The holding member 31 is preferably at least rigid and strong enough to resist deformation under conditions of the maximum expected vibration from the vehicle provided with the power conversion device 40. For example, the holding member 31 may be formed from the same metal material as the housing 10.

In the example of FIG. 3, the substrate 11 is directly fixed to the housing 10 with the substrate fixing members 46. However, the substrate 11 may be fixed to a fixation frame with any shape separate from the housing 10 and fixed to the housing 10. In this case, the substrate 11 may be fixed to the fixation frame with the substrate fixing members 46. The fixation frame is at least rigid and strong enough to resist deformation under conditions of the maximum expected vibration from the vehicle provided with the power conversion device 40. For example, the fixation frame is formed from the same metal material as the housing 10.

The connection position of each of the voltage sensors 1 to 3 is not limited to the above examples. In one example, each of the voltage sensors 1 to 3 may be connected to a busbar connected to each secondary terminal of the power convertor 44.

Each of the voltage sensors 1 to 3 may be mounted in any electronic device including busbars other than the power conversion device 40. More specifically, each of the voltage sensors 1 to 3 may be attached to busbars included in any electronic device and measure the potential difference between any busbars. The voltage sensors 1 to 3 may measure AC voltages rather than DC voltages.

The first connecting member 12 may have any structure and shape that can electrically connect the first electrode 14 to the first busbar 45a and fix the substrate 11 to the first busbar 45a. In one example, the first connecting member 12 may include the first fastener member 18 and a spacer in contact with the substrate 11 and to be in contact with the first busbar 45a. In this case, the first electrode 14 is electrically connected to the first busbar 45a through the first fastener member 18. The same applies to the second connecting member 13.

The shape of the first electrode 14 is not limited to the above examples, but may be any shape that can be in contact with the first collar 17. In one example, the end of the first electrode 14 nearer the second main surface 11b may have a flat-bottomed groove fitted with the first collar 17. The same applies to the second electrode 15.

The shape the first conductive member 23 is not limited to the above examples, but may be any shape to which the first busbar 45a and the third busbar 45c can be attached. In one example, the first conductive member 23 may be a prism. The same applies to the second conductive member 27.

The first insulating member 24 may have any shape that can insulate the first conductive member 23 from the housing 10. The second insulating member 28 may have any shape that can insulate the second conductive member 27 from the housing 10. In one example, the first insulating member 24 may be a bent column similarly to the first conductive member 23. In another example, the first insulating member 24 may be disposed such that only two end faces of the first conductive member 23 are exposed that are orthogonal to the direction in which the first conductive member 23 extends. In this case, the first insulating member 24 may have a fixation hole extending through the first insulating member 24 and continuous with the fixation hole 26c in the first conductive member 23.

The method of fixing the substrate 11 to the first busbar 45a and the second busbar 45b is not limited to the above examples, but may be any fixing method that can maintain the positional relationships between the substrate 11 and the first busbar 45a and between the substrate 11 and the second busbar 45b under conditions of the maximum expected vibration from the vehicle. In one example, the substrate 11 may be fixed to the first busbar 45a by clamping the first fastener member 18.

The method of fixing the substrate 11 to the first conductive member 23 and the second conductive member 27 is not limited to the above examples, but may be any fixing method that can maintain the positional relationships between the substrate 11 and the first conductive member 23 and between the substrate 11 and the second conductive member 27 under conditions of the maximum expected vibration from the vehicle. In one example, the substrate 11 may be fixed to the first conductive member 23 by bonding the first fastener member 18 to the first conductive member 23 with an adhesive.

The power convertor 44 is not limited to the above examples, but may be any power converter circuit that converts electric power supplied from a power supply into electric power to be fed to the load 61. In one example, the power convertor 44 may be a DC-DC converter.

The numbers of substrate fixing members 46 and supporting-member-fixing members 48 are not limited to the above examples, but may be determined as appropriate for, for example, the size and the weight of the substrate 11.

The power conversion device 40 may be mounted in any movable body other than a railway vehicle, such as an automobile, a vessel, or an aircraft.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

REFERENCE SIGNS LIST 1, 2, 3 Voltage sensor
10 Housing
11 Substrate
11a First main surface
11b Second main surface
12 First connecting member
13 Second connecting member 14 First electrode
15 Second electrode
16 Measurement circuit
17 First collar
17a, 19a Through-hole
18 First fastener member
18a, 20a Nut
19 Second collar
20 Second fastener member
21 First supporting member
22 Second supporting member
23 First conductive member
23a, 23b, 27a, 27b End portion
24 First insulating member
25a, 25b, 29a, 29b Fastener member
26a, 26b, 26c, 30a, 30b, 30c, 47a, 47b, 47c, 47d Fixation hole
27 Second conductive member
28 Second insulating member
31 Holding member
31a Insertion hole
40 Power conversion device
41a Positive input terminal
41b Negative input terminal
42a, 42b, 42c Output terminal
43 Main circuit
44 Power convertor
45a First busbar
45b Second busbar
45c Third busbar
45d Fourth busbar
46 Substrate fixing member
48 Supporting-member-fixing member
51 Controller
61 Load
FC1 Filter capacitor

The invention claimed is:

1. A voltage sensor for measuring a potential difference between a first busbar and a second busbar, the voltage sensor comprising:
 a substrate on which a first electrode, a second electrode, and a measurement circuit are disposed, the measurement circuit being configured to measure the potential difference between the first busbar and the second busbar by measuring a potential difference between the first electrode and the second electrode;
 a first connecting member for electrically connecting the first electrode to the first busbar and fixing the substrate to the first busbar;
 a second connecting member for electrically connecting the second electrode to the second busbar and fixing the substrate to the second busbar; and
 a first supporting member for electrically connecting the first busbar and a third busbar to each other and supporting the first busbar and the third busbar,
 wherein the first supporting member includes
  a first conductive member to which the first busbar and the third busbar are to be fixed, the first conductive member being for electrically connecting the first busbar and the third busbar to each other, and
  a first insulating member formed from an insulating material and covering the first conductive member, and
  the first connecting member electrically connects the first electrode to the first conductive member.

2. The voltage sensor according to claim 1, wherein the first connecting member includes
 a first collar comprising an electric conductor that is tubular, and
 a first fastener member disposed through the first collar and being for fixing the substrate to the first busbar with the first collar being in contact with the first electrode and the first busbar.

3. The voltage sensor according to claim 2, wherein the first collar has conductivity higher than conductivity of the first fastener member.

4. The voltage sensor according to claim 1, wherein the first connecting member fixes the substrate to the first conductive member.

5. A power conversion device, comprising:
 a main circuit to convert supplied electric power into electric power to be fed to a load, and feed to the load the electric power resulting from the conversion;
 the voltage sensor according to claim 4; and
 a housing accommodating the main circuit and the voltage sensor.

6. The power conversion device according to claim 5, further comprising:
 a substrate fixing member formed from an insulating material and fixing to the housing the substrate included in the voltage sensor.

7. A power conversion device, comprising:
 a main circuit to convert supplied electric power into electric power to be fed to a load, and feed to the load the electric power resulting from the conversion;
 the voltage sensor according to claim 4;
 a housing accommodating the main circuit and the voltage sensor; and
 a supporting-member-fixing member fixing to the housing the first supporting member included in the voltage sensor.

8. A power conversion device, comprising:
 a main circuit to convert supplied electric power into electric power to be fed to a load, and feed to the load the electric power resulting from the conversion;
 the voltage sensor according to claim 1; and
 a housing accommodating the main circuit and the voltage sensor.

9. The power conversion device according to claim 8, further comprising:
 a substrate fixing member formed from an insulating material and fixing to the housing the substrate included in the voltage sensor.

10. A power conversion device, comprising:
 a main circuit to convert supplied electric power into electric power to be fed to a load, and feed to the load the electric power resulting from the conversion;
 the voltage sensor according to claim 1;
 a housing accommodating the main circuit and the voltage sensor; and
 a supporting-member-fixing member fixing to the housing the first supporting member included in the voltage sensor.

* * * * *